United States Patent [19]

Funaba

[11] Patent Number: 5,811,842
[45] Date of Patent: Sep. 22, 1998

[54] SEMICONDUCTOR PHOTODETECTOR INCLUDING BACKGROUND LIGHT REGION

[75] Inventor: Shinji Funaba, Tokyo, Japan

[73] Assignee: Mitsubishi Denki Kabushiki Kaisha, Tokyo, Japan

[21] Appl. No.: 743,937

[22] Filed: Nov. 5, 1996

[30] Foreign Application Priority Data

Apr. 23, 1996 [JP] Japan ................................. 8-101481

[51] Int. Cl.[6] .......................... H01L 29/205; H01L 31/107
[52] U.S. Cl. ........................ 257/186; 257/184; 257/292; 257/461
[58] Field of Search ..................................... 257/292, 184, 257/186; 259/290, 292, 293, 460, 461, 463

[56] References Cited

U.S. PATENT DOCUMENTS

| | | | |
|---|---|---|---|
| 5,315,148 | 5/1994 | Fujimura | 257/461 |
| 5,332,919 | 7/1994 | Fujimura | 257/461 |
| 5,481,124 | 1/1996 | Kozuka et al. | 257/292 |

FOREIGN PATENT DOCUMENTS

| | | | |
|---|---|---|---|
| 000473197 | 3/1992 | European Pat. Off. | 257/461 |
| 000473198 | 3/1992 | European Pat. Off. | 257/461 |
| 000522746 | 1/1993 | European Pat. Off. | 257/461 |
| 402214171 | 8/1990 | Japan | 257/461 |
| 403297169 | 12/1991 | Japan | 257/290 |
| 5-121777 | 5/1993 | Japan . | |
| 5-235396 | 9/1993 | Japan . | |

OTHER PUBLICATIONS

"Photo Communication Engineering", Feb. 15, 1984, pp. 372–373 (No English Translation).

*Primary Examiner*—Jerome Jackson
*Attorney, Agent, or Firm*—Leydig, Voit & Mayer, Ltd.

[57] ABSTRACT

In a photodiode, p-type background light capture regions at least partially surround a p-type light sensing region and are spaced at a distance from the light sensing region. Holes generated in response to background light are captured by depletion layers of the background light capture regions and do not influence photocurrent. Thus, no deterioration in response speed occurs and the response speed is increased.

8 Claims, 7 Drawing Sheets

$N (10^{15} cm^{-3})$ (1) : $Nmin = \dfrac{2\varepsilon}{gL^2} V_{Bmin}$ (2) : $N = \left(\dfrac{Eg}{1.1}\right)^2 \times \left(\dfrac{60}{V_{Bmin}}\right)^{4/3} \times 10^{16}$

SEMICONDUCTOR PHOTODETECTOR INCLUDING BACKGROUND LIGHT REGION

FIELD OF THE INVENTION

The present invention relates to a semiconductor photodetector suitable for use in optical communications.

BACKGROUND ART

FIG. 8 is a cross-sectional view of a conventional InGaAs/InP photodiode, a semiconductor photodetector or light sensing device. The photodiode comprises an n$^+$InP substrate 1, an n$^-$InGaAs light absorption layer 2, an n$^-$InP window layer 3, a Zn diffused p-type light sensing region 4, an SiN passivation film 5, an SiO$_2$ film 6, a p-side electrode 7, and an n-side electrode 8. Further, symbols D, H, and R respectively indicate a depletion layer, a hole, and a photodetecting or light sensing region.

In operation, a reverse bias is applied between the p-side electrode 7 and the n-side electrode 8 to create the depletion layer D within the light absorption layer 2. Light incident on the light sensing region R passes through the light sensing region 4 and, in response, electron-hole pairs are generated within the depletion layer D. Further, the electron-hole pairs are separated from each other by an electric field in the depletion layer so that a photocurrent flows in an external circuit. Each hole H within the depletion layer D moves at a saturation velocity, v=2×10$^6$cm/s, due to the electric field and is quickly collected as a photocurrent. A high-speed response to the incident light is realized.

In the conventional photodiode, a satisfactory response characteristic can be obtained when the light enters into the light sensing region R. However, when light (background light) is incident outside of the light sensing region R, holes H produced outside the depletion layer D diffuse due to concentration gradients and reach the depletion layer D, where they are collected as a photocurrent. This photocurrent reduces the speed of the high-speed response. As a result, tailing occurs in the wave-form of the response to a high-speed pulsed light, as indicated by S in FIG. 9, thereby making discrimination between a "0" and a "1" signal difficult.

SUMMARY OF THE INVENTION

The present invention solves the aforementioned problems. It is an object of the present invention to provide a photodetector or a photodiode free from the influence of background light incident outside of a light sensing region and that has an excellent response characteristic.

According to one aspect of the present invention, a semiconductor photodetector includes a first conductivity type semiconductor substrate; a first conductivity type semiconductor layer disposed on the semiconductor substrate; a second conductivity type light sensing region disposed in a part of the first conductivity type semiconductor layer; a second conductivity type background light capture region in a part of the first conductivity type semi-conductor layer, at least partially surrounding the light sensing region, and spaced from the light sensing region by a distance L; a short-circuiting electrode establishing a short-circuit between the background light capture region and the first conductivity type semiconductor layer; and first and second electrodes electrically connected to the first conductivity type semiconductor layer and the light sensing region, respectively, wherein the distance L is chosen to ensure a minimum voltage break-down VB$_{min}$ for a particular conductivity of the first conductivity type semiconductor layer and $$N_{min}=(2\epsilon/qL^2)VB_{min}$$

where N$_{min}$ is a minimum charge carrier density of the first conductivity type semiconductor layer, $\epsilon$ is the dielectric constant of said the first conductivity type semiconductor layer, and q is the elemental electric charge. In another aspect of the present invention, in the semiconductor photodetector, the background light capture region is deeper in the first conductivity type layer than is the light sensing region.

In an additional aspect of the present invention, in the semiconductor photodetector, the background light capture region is deeper in the first conductivity type layer than in the light sensing region.

In still another aspect of the present invention, in the semiconductor photodetector, an opaque metal is disposed between the light sensing region and the background light capture region.

In yet another aspect of the present invention, in the semiconductor photodetector, the short-circuiting electrode is a metal film and/or a semiconductor film having a band gap energy smaller than the band gap energy of the semiconductor substrate.

In a further aspect of the present invention, in the semiconductor photodetector, the short-circuiting electrode is present on a device surface where the first conductivity type layer is exposed.

In one aspect of the present invention, in the semiconductor photodetector, the width of the exposed first conductivity type layer is at least twice the width of a depletion layer between the background light capture region and the second conductivity type region.

In another aspect of the present invention, in the semiconductor photodetector, the short-circuiting electrode is located on a highly doped first conductivity type region in the exposed first conductivity type region.

In a further aspect of the present invention, in the semiconductor photodetector, the electrode for the first conductivity type region also serves as the short-circuiting electrode.

In still another aspect of the present invention, the semiconductor photodetector includes a plurality of second conductivity type light sensing regions in the first conductivity type semiconductor layer and a plurality of background light capture regions, the background light capture regions being disposed between respective light sensing regions.

Other features and advantages of the invention will be apparent from the following description.

BRIEF DESCRIPTION OF THE DRAWINGS

Throughout the drawings, the same reference numerals refer to the same or like elements.

DESCRIPTION OF THE PREFERRED EMBODIMENTS

First Embodiment

Figure 1A:
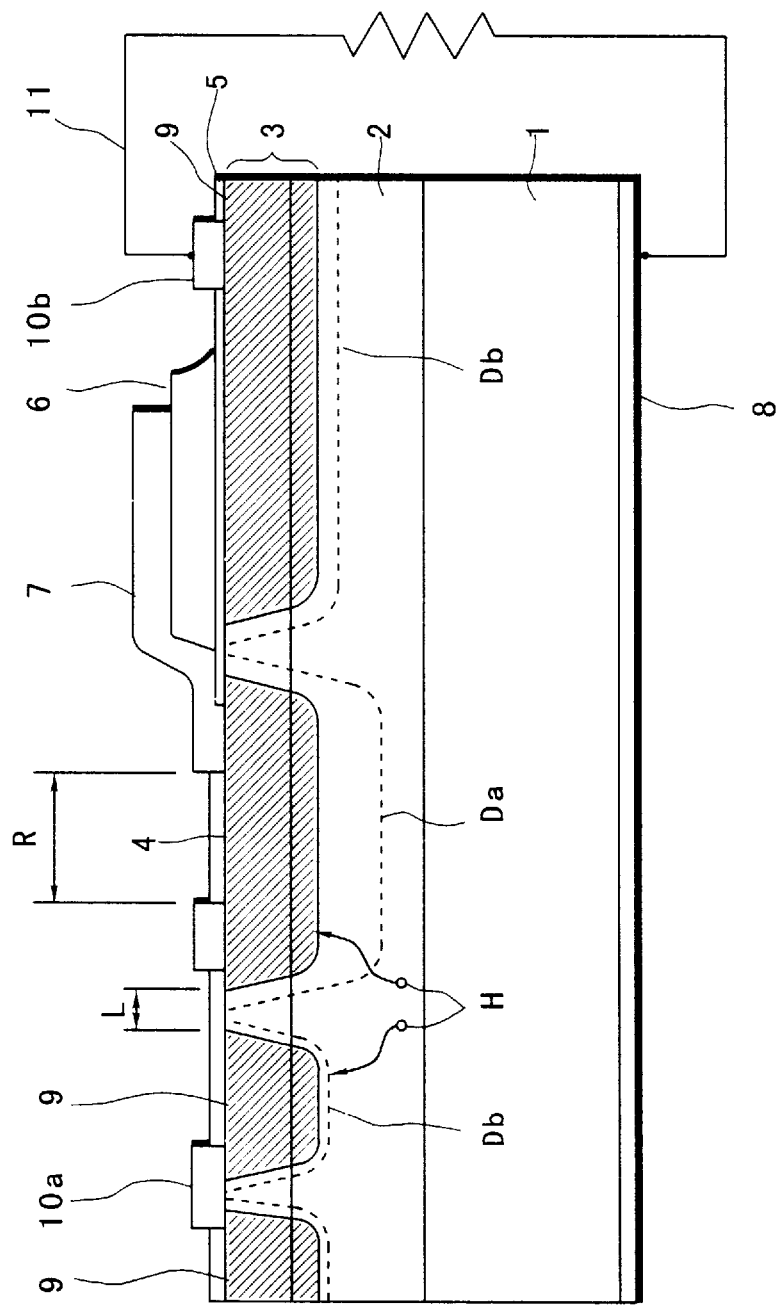
FIG. 1(a) is a cross-sectional view and FIG. 1(b) is a plan view respectively showing a photodiode according to a first embodiment of the present invention.
Figure 1B:
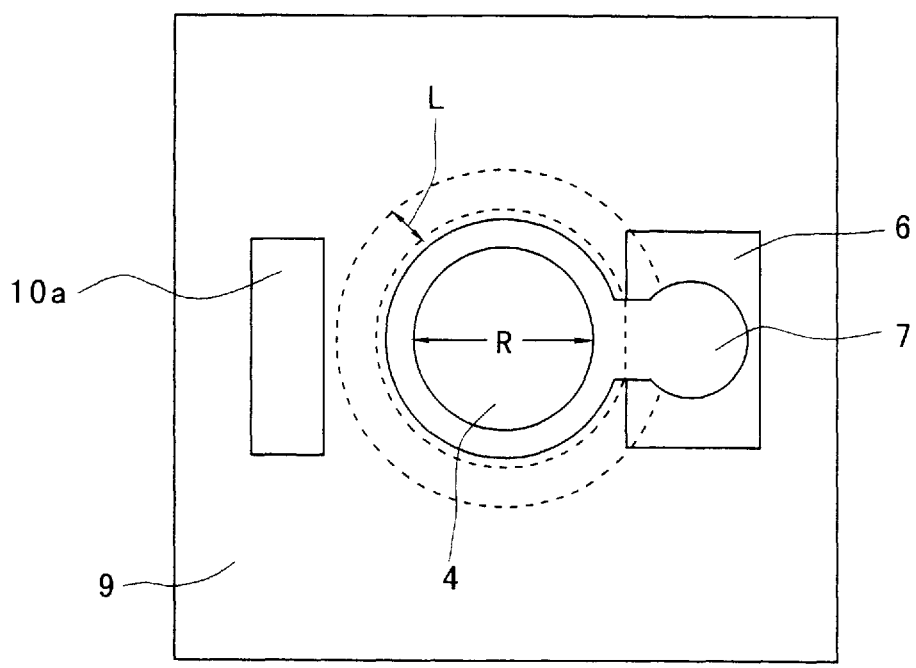

FIG. 1($a$) is a cross-sectional view and FIG. 1($b$) is a plan view showing a photodiode, i.e., light sensing device, according to a first embodiment of the present invention. As shown in the drawing, the photodiode includes an n$^+$InP substrate 1 as a first conductivity type semiconductor substrate, an n$^-$InGaAs light absorption layer 2, and an n$^-$InP window layer 3. Further, the photodiode includes a Zn diffused p-type light sensing or photodetecting region 4. A pn junction formed by the light sensing region 4 operates as a photodiode. The photodiode further includes an SiN passivation film 5 and an SiO$_2$ film 6. A p-side electrode 7 is disposed on an upper surface of the photodiode. An n-side electrode 8 is disposed on the rear side of the photodiode.

In the photodiode, Zn diffused p-type background light capture regions 9 at least partially surround the light sensing region 4 and are spaced by a distance or width of at least L from the light sensing region 4. A short-circuiting electrode 10$a$ is provided for establishing a direct short-circuit between the background light capture region 9 and the n$^-$InP window layer 3. A short-circuiting electrode 10$b$ contacts the background light capture region 9 and is short-circuited to the semiconductor substrate 1 through a metal lead 11. Da and Db respectively indicate a depletion layer formed by the light sensing region 4 and a depletion layer formed by a background light capture region 9. H and R respectively indicate holes and a light sensing or photo-detecting region. In operation, a reverse bias is applied between the p-side electrode 7 and the n-side electrode 8 so that the depletion layers Da and Db are formed in the light absorption layer 2. Light incident on the light sensing region R passes through the region 4 and generates electron-hole pairs within the depletion layer Da. The electron-hole pairs are separated from each other by the electric field of the depletion layer so that a photocurrent flows in an external circuit. Each of the holes H produced within the depletion layer Da moves at a saturation velocity of 2×10$^6$cm/s due to the electric field of the depletion layer and quickly contributes to the photocurrent. Therefore, a high-speed response to incident light is realized.

On the other hand, each of the holes H resultant from the light incident outside of the light sensing region R is captured within the depletion layer Db formed by the background light capture region 9. Thus, these holes H are prevented from entering the depletion layer Da and do not influence the photocurrent. Therefore, the deterioration in the response characteristic that occurs in the conventional photodiode does not occur and the response speed is increased. Further, the holes H captured by the background light capture region 9 recombine or are quenched by the short-circuiting electrodes 10$a$ and 10$b$. Thus, holes H are not stored in the background light capture regions 9 and charging does not occur. The short-circuiting electrodes 10$a$ and 10$b$ function in the same way, so that either one may be present.

A method of calculating the shortest distance L between the light sensing region 4 and the background light capture region 9 in the present invention will now be described.

In general, a width w of a depletion layer is given by the following equation:

$$w = (2V\epsilon/qN)^{1/2} \qquad (a).$$

In equation ($a$), $\epsilon$ is the dielectric constant of a semiconductor layer. In the present embodiment, $\epsilon$ is the dielectric constant of InP or InGaAs. N is charge carrier density in the semiconductor layer. In the present embodiment, N is the charge carrier density of n$^-$InP or n$^-$InGaAs. q is the elemental electronic charge.

Assuming that, in the present invention, a lower limit VB$_{min}$ of a specified breakdown voltage V corresponds to the applied voltage when the shortest distance L between the light sensing region 4 and the background light capture region 9 reaches the width w of the depletion layer Da formed by the light sensing region 4 (w=L). Then, the expression ($a$) is rewritten as:

$$L = (2VB_{min} \, \epsilon/qN)^{1/2} \qquad (b).$$

VB$_{min}$ is a lower limit breakdown voltage required by a specification for a particular use of the photodiode.

The depletion layer width w becomes substantially equal to L at a lower voltage V if the carrier density N is lower, so that VB$_{min}$ depends on N$_{min}$. Therefore, assuming that N=N$_{min}$, the expression (b) is rewritten as:

$$L = (2VB_{min} \, \epsilon/qN_{min})^{1/2} \qquad (c).$$

Thus, N$_{min}$ is derived from the above expression ($c$) as follows:

$$N_{min} = (2\epsilon/qL^2)VB_{min} \qquad (1).$$

Figure 2:
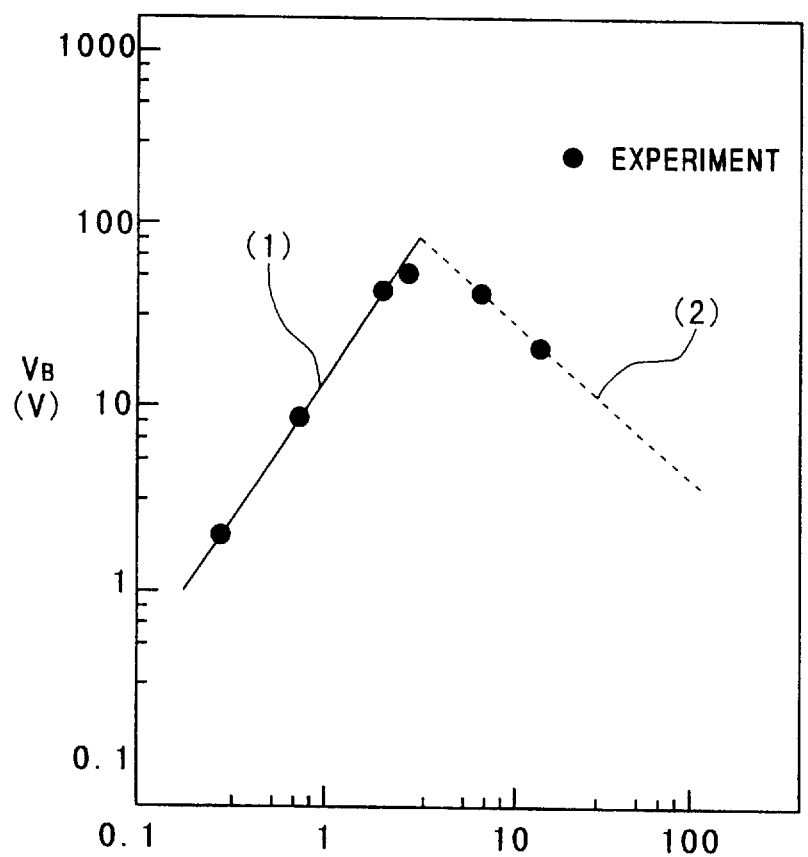
FIG. 2 is a diagram showing the relationship between breakdown voltage and charge carrier density in a photodiode according to a first embodiment of the present invention.
Figure 3A:
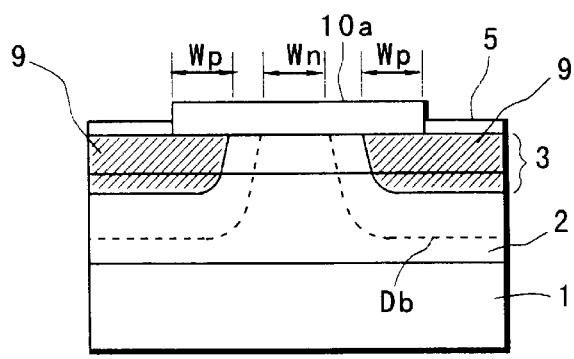
FIGS. 3(a)–3(d) are sectional views showing four examples of the short-circuiting electrodes in a photodiode according to a first embodiment of the present invention.
Figure 3B:
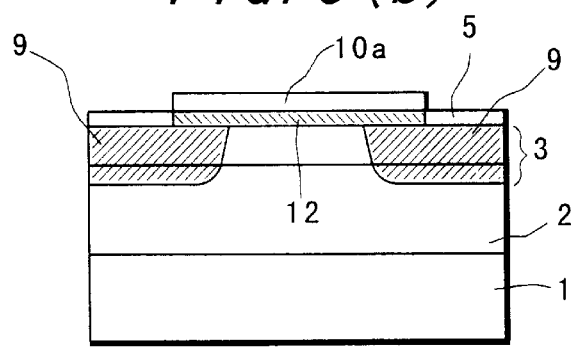
Figure 3C:
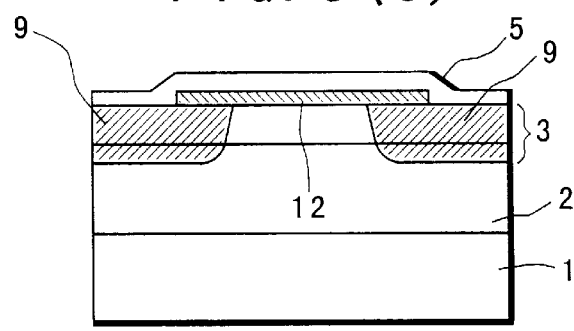
Figure 3D:
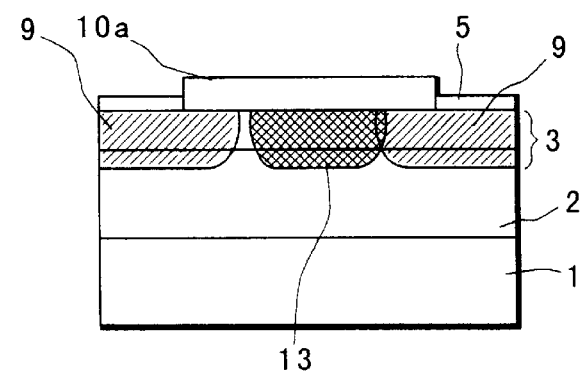

On the other hand, it has been confirmed by experiments that the standardized lower limit VB$_{min}$ of the breakdown voltage V is determined when w has becomes substantially equal to L (w=L). Experimental results are disclosed below for the first time. FIG. 2 is a diagram showing the relationship between breakdown voltage VB and charge carrier density N when the width extending from a diffusion front of the light sensing region 4 and the background light capture region 9 is 8 μm. In the drawing, the straight line indicates the following expression:

$$N_{min} = (2\epsilon/qL^2)VB_{min} \qquad (1)$$

Further, the broken line indicates the following expression:

$$N = (E_g/1.1)^2 \times (60/VB_{min})^{4/3} \qquad (2).$$

In the above expression, E$_g$ is the band gap energy of InP or InGaAs. Expression (2) is generally known. Since the expression (1) coincides well with experimental values, the assumption of expression (1) can be considered to be correct.

Thus, in order to obtain a breakdown voltage above VB$_{min}$ with the structure according to the present embodiment, the relations in expressions (1) and (2) are established between the shortest distance L, between the light sensing region 4 and the surrounding background light capture region 9, and the minimum value $N_{min}$ and maximum value $N_{max}$ of the charge carrier density of the n⁻InP window layer 3 or the n¹ InGaAs light absorption layer 2. Here, the minimum value $N_{min}$ of the charge carrier density is the minimum charge carrier density determined from FIG. 2 and the equation (1) to make the breakdown voltage not less than a specified minimum value $VB_{min}$. The maximum value $N_{min}$ of the charge carrier density is the maximum carrier density determined from FIG. 2 and the equation (2) to make the breakdown voltage not less than the specified minimum value $VB_{min}$.

According to the expressions (1) and (2), when the distance L between the light sensing region 4 and the background light capture region 9 is 10 μm, the charge carrier density of InGaAs required to obtain a breakdown voltage $VB_{min}=40V$ is $N_{min}=6\times10^{14}$ cm⁻³ and $N_{max}=8\times10^{15}$ cm$^{31\ 3}$, while the charge carrier density of InP is $N_{min}=5\times10^{14}$ cm$^{31\ 3}$ and $N_{max}=2\times10^{16}$ cm$^{31\ 3}$.

FIGS. 3(*a*)–3(*d*) are sectional views showing four examples of a short-circuiting electrode.

FIG. 3(*a*) shows a basic structure in which an n⁻InP window layer 3, a first conductivity type region, is exposed at a background light capture region 9 and short-circuited directly to a metal short-circuiting electrode 10*a*. Since a region Wn free of a depletion layer Db is required for conductivity in the first conductivity type region 3 surrounded by p-type background light capture regions 9, a second conductivity type region, the n⁻InP window layer 3, is exposed over a width more than twice the width of the depletion layer Db. In this case, it is necessary to ensure a region Wn of the n⁻window layer 3 through which the depletion layers Db do not reach, and a region Wp on the background light capture region 9 to obtain low contact resistance.

FIG. 3(*b*) shows a structure in which a crystalline layer 12 having a band gap energy smaller than the band gap energy of the InP substrate 1, e.g., an InGaAs layer, is provided between a short-circuiting metal electrode 10*a* and an n⁻InP window layer 3 to provide a further reduction in contact resistance.

FIG. 3(*c*) illustrates a structure in which a short-circuit is established only by the crystalline layer 12 having a band gap energy smaller than the band gap energy of the semiconductor substrate 1, e.g., the InGaAs layer 12, without using a metal short-circuiting electrode 10*a*, as shown in FIG. 3(*b*). The InGaAs layer 12 is covered with a passivation film 5, for example, an SiN passivation film. The present structure is effective when it is required not to expose the short-circuited region.

FIG. 3(*d*) shows a structure in which a dopant impurity producing n-type conductivity is introduced into a short-circuited portion of an n⁻InP window layer 3 as a lower portion of a short-circuiting electrode 10*a* to form a highly doped n-type region 13. This structure is effective in reducing the size of the short-circuiting portion or when a semi-insulating layer is used as an alternative to the n⁻InP window layer 3.

In the structure of the photodiode according to the present embodiment, the light sensing region 4 and the background light capture regions 9 can be simultaneously processed photolithographically using the same mask. Further, a diffusion process producing p-type conductivity can also be effected for the light sensing region 4 and the background light capture regions 9 simultaneously. Furthermore, the p-side electrode 7 and the short-circuiting electrodes 10*a* and 10*b* can also be formed simultaneously using the same mask. Thus, the photodiode according to the present embodiment can be easily manufactured because only one mask needs to be changed as compared with the conventional manufacturing process so the need for the introduction of additional processes and devices is avoided.

Second Embodiment

Figure 4:
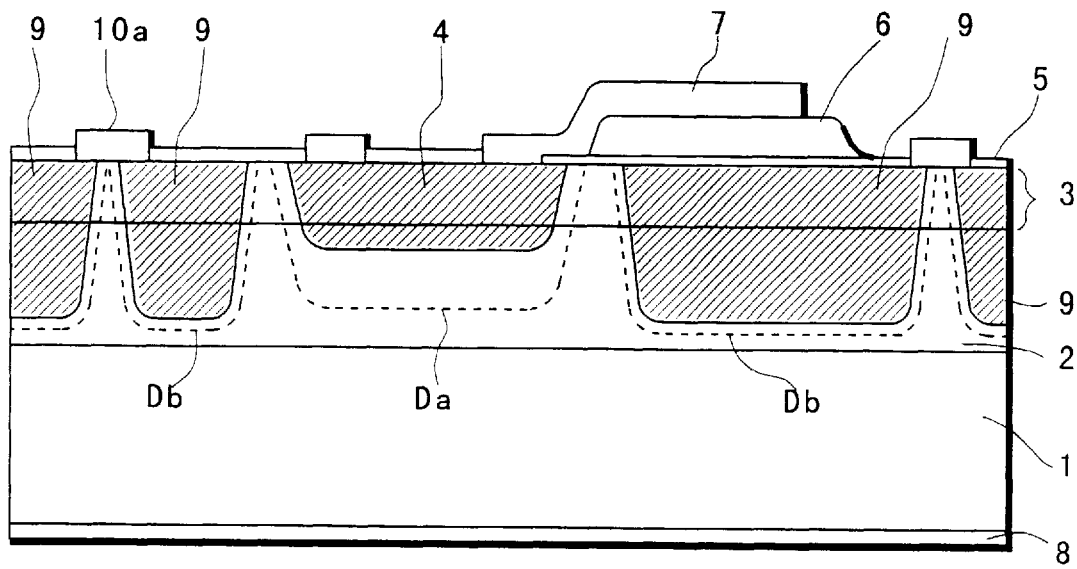
FIG. 4 is a cross-sectional view showing a photodiode according to a second embodiment of the present invention.

FIG. 4 is a cross-sectional view showing a photodiode according to a second embodiment of the present invention. As shown in FIG. 4, the diffusion front of the background light capture region 9 is deeper than the diffusion front of the light sensing region 4. The diffusion front of the background light capture region 9 may, in some cases, reach the n⁻InP substrate 1.

In the photodiode according to the second embodiment, the diffusion of the dopant producing p-type conductivity cannot be simultaneously effected in the light sensing region 4 and the background light capture regions 9, as in the first embodiment, so it is necessary to form regions individually. However, holes generated in response to background light can be captured substantially completely.

Third Embodiment

Figure 5:
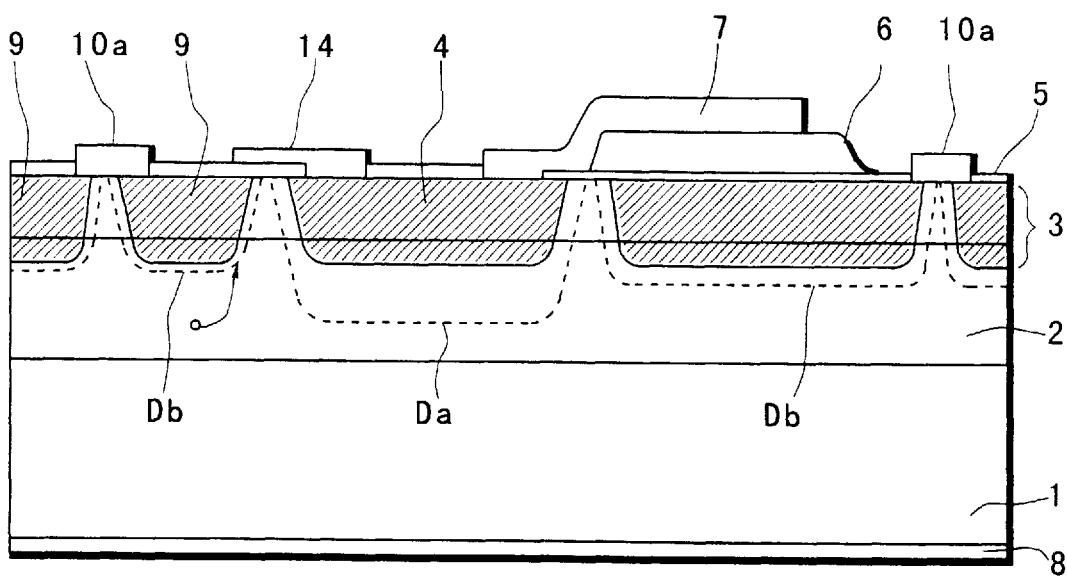
FIG. 5 is a cross-sectional view showing a photodiode according to a third embodiment of the present invention.

FIG. 5 is a cross-sectional view of a photodiode according to a third embodiment of the present invention. The photodiode includes an opaque metal 14 disposed between the light sensing region 4 and the background light capture region 9 with an electrically insulating passivation film 5 interposed between at least the metal 14 and the background light capture region 9. The opaque metal 14 may be a part of the p-side electrode 7.

In the photodiode according to the first and second embodiments, holes H generated in response to light incident at the clearance between the light sensing region 4 and the background light capture region 9 may not be collected by either of the light sensing region 4 or the background light capture region 9. The holes diffuse due to a concentration gradient and reach the depletion layer Da, resulting in a photocurrent. Therefore, the holes H have the possibility of deteriorating high-speed response. According to the present embodiment, the opaque metal 14 between the light sensing region 4 and the background light capture region 9 prevents the background light from entering the window layer 3. Therefore, no deterioration in the response characteristic occurs and, hence, the response speed is further increased.

Fourth Embodiment

Figure 6:
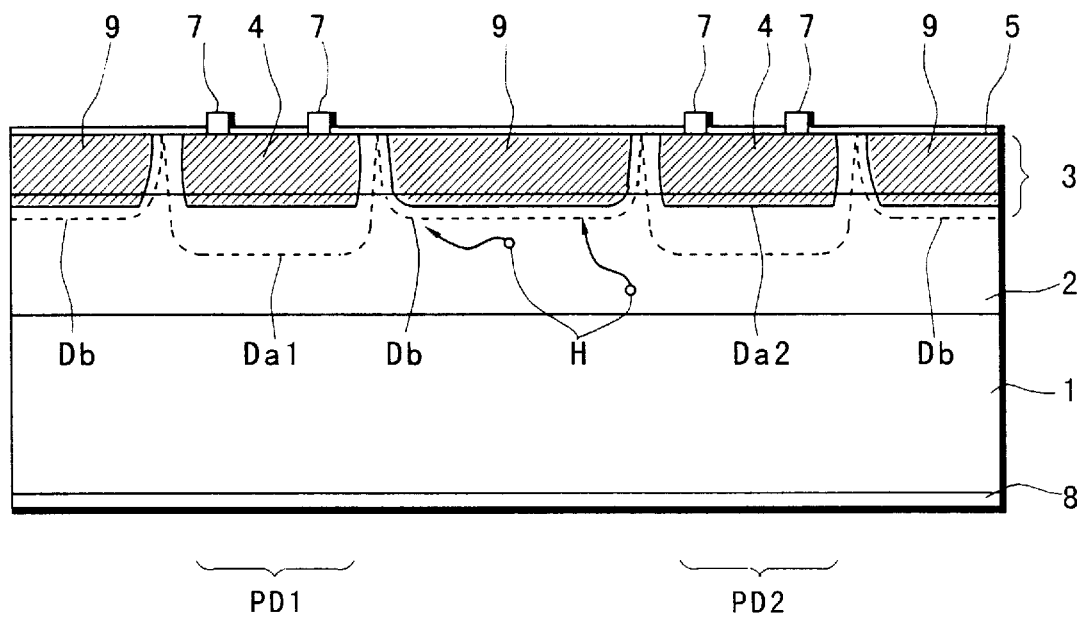
FIG. 6 is a cross-sectional view showing a photodiode array according to a fourth embodiment of the present invention.

FIG. 6 is a cross-sectional view of a photodiode array according to a fourth embodiment of the present invention. The photodiode array includes two photodiodes, PD1 and PD2.

A conventional photodiode array must suppress crosstalk in which holes H produced by light incident on, for example, PD2 diffuse into a region of PD1 to produce a dark current. According to the present embodiment, however, since a background light capture region 9 is located between the two photodiodes PD1 and PD2, diffusing holes H, which may cause the crosstalk, are captured.

Fifth Embodiment

Figure 7:
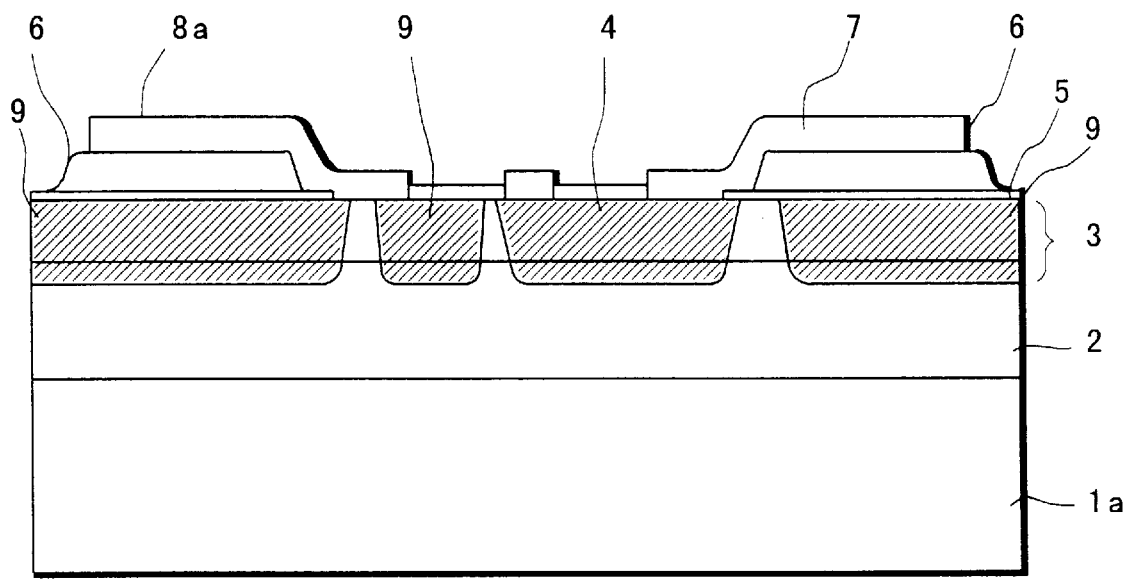
FIG. 7 is a cross-sectional view showing a photodiode according to a fifth embodiment of the present invention.
Figure 8:
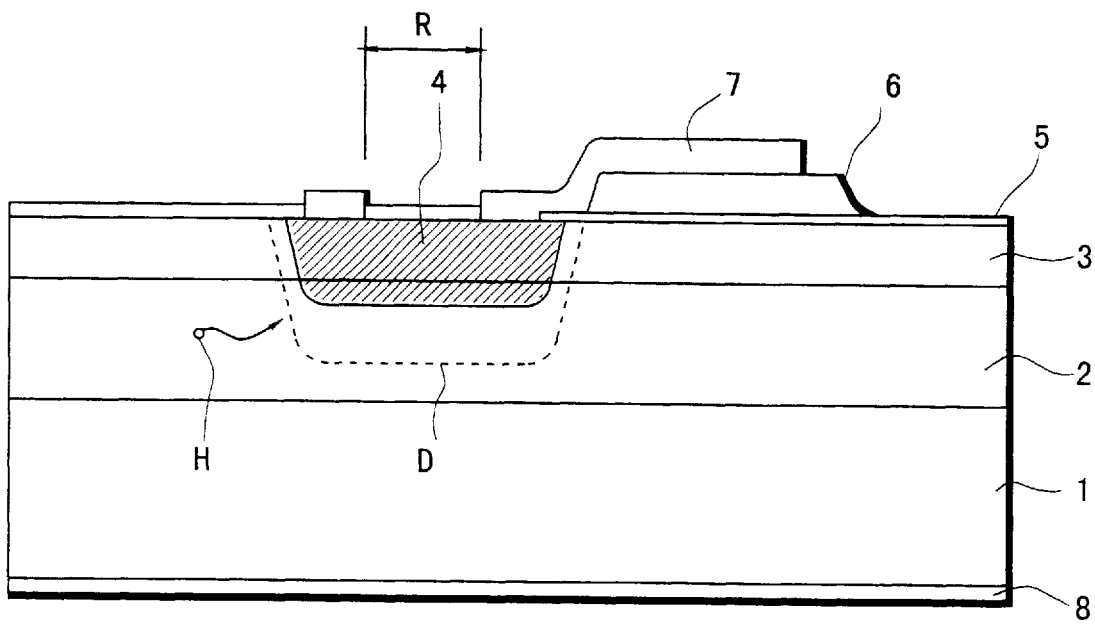
FIG. 8 is a cross-sectional view showing a conventional photodiode.
Figure 9:
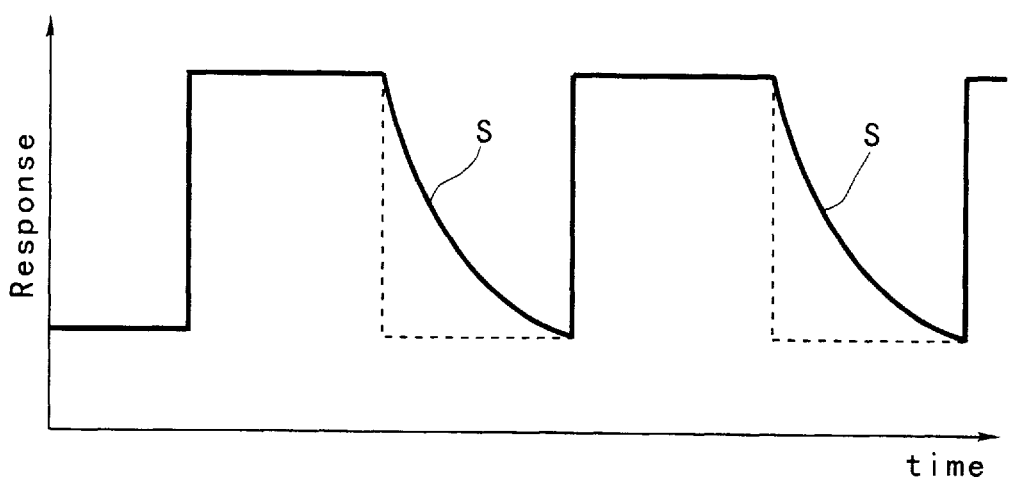
FIG. 9 shows a waveform of a response of a conventional photodiode to high-speed pulsed light.

FIG. 7 is a cross-sectional view of a photodiode according to a fifth embodiment of the present invention. The photodiode includes a semi-insulating InP substrate 1*a* and an n-side electrode 8*a*, a short-circuiting electrode electrically connecting the background light capture region 9 and the n⁻InP window layer 3 to each other. The short-circuiting electrode is utilized as an n-side electrode. The present structure is effective when it is necessary to provide two electrodes on the surface of a photodiode chip.

As has been described above, according to the present invention, background light capture regions of the second conductivity type at least partially surround the light sensing region, spaced by a distance of at least L from the light sensing region, so that holes generated in response to light incident outside of a light sensing region are captured by a depletion layer formed by the background light capture region and do not contribute to a photocurrent. Therefore, no deterioration in response characteristic takes place and the response speed is further increased.

Further, according to the present invention, $N_{min}=(2\epsilon/qL^2)VB_{min}$. Therefore, it is easy to determine the optimum values of the shortest distance L between the light sensing region and the background light capture region, a lower limit $VB_{min}$ of a device breakdown voltage, or a lower limit $N_{min}$ of a carrier density of a semiconductor layer. Thus, efficiency of design is improved.

Further, since the background light capture regions are deeper than the light sensing region, the holes generated in response to background light can be captured more reliably and the response characteristic is improved.

Furthermore, since an opaque metal is provided on a device surface between the light sensing region and the background light capture regions, holes, which may cause a deterioration in response characteristic, are not generated, whereby a high-speed response is realized.

Obviously, many modifications and variations of the present invention are possible in light of the above teachings. It is therefore understood that the invention may be practiced within the scope of the appended claims otherwise than as specifically described.

I claim:

1. A semiconductor photodetector comprising:

a first conductivity type semiconductor substrate;

a first conductivity type semiconductor layer disposed on the semiconductor substrate and having a surface;

a second conductivity type light sensing region disposed in a part of the first conductivity type semiconductor layer at the surface;

a second conductivity type background light capture region in a part of the first conductivity type semiconductor layer, surrounding the light sensing region and spaced from the light sensing region by a distance L, a portion of the first conductivity type semiconductor layer having the first conductivity type extending through a part of the second conductivity type background light capture region to the surface, outside the light sensing region;

a short-circuiting electrode disposed on the surface and establishing a short-circuit between the background light capture region and the first conductivity type semiconductor layer at the portion of the first conductivity type layer extending through part of the second conductivity type background light capture region at the surface; and first and second electrodes electrically connected to the first conductivity type semiconductor layer and the light sensing region, respectively, wherein the distance L produces a minimum voltage breakdown $VB_{min}$ and $$N_{min}=(2\epsilon/qL^2)VB_{min}$$

where $N_{min}$ is a minimum charge carrier density of the first conductivity type semiconductor layer, E is the dielectric constant of said the first conductivity type semiconductor layer, and q is the elemental electronic charge.

2. This semiconductor photodetector according to claim 1 including an opaque metal disposed between the light sensing region and the background light capture region.

3. The semiconductor photodetector according to claim 1 wherein the short-circuiting electrode is a metal film.

4. The semiconductor photodetector according to claim 1 wherein the short-circuiting electrode is a semiconductor film having a band gap energy smaller than the band gap energy of the semiconductor substrate.

5. The semiconductor photodetector according to claim 1 wherein the portion of the first conductivity type semiconductor layer extending through a part of the background light capture region includes a local region of the first conductivity type contacting the short-circuiting electrode and having a higher conductivity than elsewhere in the first conductivity type semiconductor layer.

6. The semiconductor photodetector according to claim 1 wherein the first electrode and the short-circuiting electrode are a unitary electrode located on the surface for forming a depletion layer in the first conductivity type semiconductor layer and extending from the light sensitive region.

7. The semiconductor photodetector according to claim 1 including:

a plurality of second conductivity type light sensing regions in the first conductivity type semiconductor layer;

a second conductivity type background light capture region surrounding the plurality of the light sensing regions, portions of the first conductivity type semiconductor layer of the first conductivity type extending through respective parts of the second conductivity type background light capture region to the surface, outside the respective light sensing regions;

a plurality of short-circuiting electrodes disposed on the surface and establishing respective short-circuits between corresponding background light capture regions and the first conductivity type semiconductor layer at corresponding portions of the first conductivity type semiconductor layer extending through the second conductivity type background light capture region; and a plurality of the second electrodes respectively electrically connected to corresponding light sensing regions.

8. The semiconductor photodetector according to claim 1 wherein the background light capture region extends deeper into the first conductivity type semiconductor layer than does the light sensing region.

* * * * *

UNITED STATES PATENT AND TRADEMARK OFFICE
CERTIFICATE OF CORRECTION

PATENT NO. : 5,811,842
DATED : September 22, 1998
INVENTOR(S) : Shinji Funaba

It is certified that error appears in the above-identified patent and that said Letters Patent is hereby corrected as shown below:

Column 8, Line 5, "E" to --$\epsilon$--;

Line 8, change "This" to --The--.

Signed and Sealed this

Twenty-second Day of December, 1998

Attest:

BRUCE LEHMAN

Attesting Officer Commissioner of Patents and Trademarks